US005619195A

United States Patent [19]

Allen et al.

[11] Patent Number: 5,619,195

[45] Date of Patent: Apr. 8, 1997

[54] MULTI-AXIAL POSITION SENSING APPARATUS

[75] Inventors: Clay D. Allen, Elk Grove; Andrew Martwick, Roseville, both of Calif.

[73] Assignee: Charles D. Hayes, Grass Valley, Calif.

[21] Appl. No.: 580,689

[22] Filed: Dec. 29, 1995

[51] Int. Cl.[6] .................... H03K 17/94

[52] U.S. Cl. .................... 341/20; 74/471 XY; 200/6 R

[58] Field of Search .................... 341/20; 74/471 XY, 74/519; 200/6 R; 345/161, 167

[56] References Cited

U.S. PATENT DOCUMENTS

| | | | |
|---|---|---|---|
| 4,161,726 | 7/1979 | Burson | 74/471 XY |
| 4,628,755 | 12/1986 | Hawley | 74/471 XY |
| 4,686,329 | 8/1987 | Joyce | 345/161 |
| 4,814,553 | 3/1989 | Joyce | 345/161 |
| 4,825,157 | 4/1989 | Mikan | 74/471 XY |
| 4,855,704 | 8/1989 | Betz | 341/20 |
| 5,113,714 | 5/1992 | Eklund et al. | 74/471 XY |
| 5,129,277 | 7/1992 | Lautzenhiser | 74/471 XY |
| 5,160,918 | 11/1992 | Saposnik et al. | 345/161 |
| 5,237,311 | 8/1993 | Mailey et al. | 345/167 |
| 5,293,900 | 3/1994 | Karbassi et al. | 137/554 |
| 5,302,886 | 4/1994 | Jacobsen et al. | 318/568.016 |
| 5,361,083 | 11/1994 | Pollack | 345/169 |
| 5,468,924 | 11/1995 | Naitou | 74/471 XY |

*Primary Examiner*—Jeffery Hofsass
*Assistant Examiner*—Albert K. Wong
*Attorney, Agent, or Firm*—John P. O'Banion

[57] ABSTRACT

A multi-axial position sensor assembly for a joystick in which sensor/magnet pairs are positioned orthogonally on concentric gimbal rings such that each sensor and corresponding magnet pivot in relation to each other as a result of joystick movement. The sensors produce a reference output voltage when the joystick is centered and the sensors are aligned with the magnets. As a magnet rotates in relation to a sensor, the sensor produces an output voltage which is proportional to the angle of rotation and which has a polarity dependent upon the direction of rotation relative to the centered position.

15 Claims, 6 Drawing Sheets

MULTI-AXIAL POSITION SENSING APPARATUS

BACKGROUND OF THE INVENTION

1. Field of the Invention

This invention pertains generally to computer joysticks and position controllers, and more particularly to a multi-axial position sensing apparatus for joysticks and position controllers in which Hall-effect sensors and magnets pivot to provide an output voltage proportional to angle of rotation and a polarity relative to direction of rotation.

2. Description of the Background Art

Joysticks, position controllers and the like are widely used to control computers and machinery. Such devices are generally classified as either on/off devices or proportional devices. On/off devices only provide an indication of whether displacement of the joystick has occurred, whereas proportional devices provide output signals having a magnitude indicative of the amount of displacement that has occurred. The devices may be either connected directly to the device to be controlled through a mechanical linkage, or provide output signals which are received by the device to be controlled and processed into the corresponding control functions.

To overcome common problems associated with mechanical linkages between the joystick and the device to be controlled, most joysticks now produce electrical signals to indicate joystick movement. In such devices, sensors are employed to detect displacement of the joystick. The sensors generate electrical signals upon movement of the joystick which are sent to the device to be controlled, or which activate intermediate relays, motors and the like. However, even though electronic joysticks overcome common problems associated with mechanical linkages, the sensors traditionally used have been mechanical switches and potentiometers which suffer from wear, breakage, loss of accuracy and similar problems. Therefore, there has been a trend toward contactless joysticks.

A commonly used contactless joystick employs Hall-effect sensors and magnets. By changing the distance between a magnet and a Hall-effect sensor the output voltage of the sensor will change. Thus, movement of the joystick is detected by a change in output voltage resulting from a change in relative position between the magnet and the Hall-effect sensor. However, a difficulty often encountered in such devices is ensuring that a reasonable strength from the magnet is present at the sensor over the entire range of joystick movement. Another problem is that Hall-effect sensors can suffer from saturation effects when subjected to high magnetic fields and, therefore, discrimination between small displacements of joystick movement can be difficult. Also, in order to detect motion in the +x, −x, +y and −y directions, as well as in intermediate directions, at least four sensors or magnets have been required and some joysticks have employed as many as seven sensors. This results in increased cost, size and difficulty in maintaining sensor calibration.

Therefore, there is a need for a multi-axial position sensing apparatus which employs as few contactless sensors as possible, which is compact, and which provides for a high degree of repeatability and accuracy. The present invention satisfies those needs, as well as others, and overcomes deficiencies found in conventional devices.

SUMMARY OF THE INVENTION

The present invention generally comprises a multi-axial position sensor assembly for joysticks, position controllers and the like, in which Hall-effect sensors and magnets pivot in relation to each other in response to joystick movement. The sensors produce a reference voltage when the joystick is centered and, as a magnet and sensor pivot in relation to a each other, the sensor produces an offset voltage which is proportional to the angle of rotation and which has a polarity dependent upon the direction of rotation relative to the centered position.

By way of example and not of limitation, the invention includes a gimbal assembly comprising inner, intermediate and outer rings which are concentrically aligned. The intermediate gimbal ring includes four arcuate receptacles positioned around the circumference of the gimbal ring and spaced apart by ninety degrees of rotation, as well as a circuit board to which a pair of Hall-effect sensors and associated cabling are attached. The Hall-effect sensors are aligned with two of the adjacent arcuate receptacles, so that they are also spaced apart by ninety degrees. The inner gimbal ring and the outer gimbal ring each include a pair of arms which are spaced apart by one hundred and eighty degrees of rotation. The arms on the inner gimbal ring extend outward, while the arms on the outer gimbal ring extend inward. One of the arms on each of the inner and outer gimbal rings carries a small magnet which is aligned with a corresponding Hall-effect sensor.

When the gimbal rings are coupled together, the inner gimbal ring pivots in relation to the intermediate gimbal ring about a first axis, and the outer gimbal ring pivots in relation to the intermediate gimbal ring about a second axis which is orthogonal to the first axis. These axes intersect at the center of concentricity of said gimbal rings and define the axis of rotational motion between the magnets and the Hall-effect sensors.

Each magnet is oriented so that its poles are perpendicular to the face of the corresponding Hall-effect sensor. When the three gimbal rings are aligned in parallel planes, the magnetic field lines are generally parallel to the face of the Hall-effect sensors and a reference voltage is produced. Hence, this position is considered the null point of the assembly. When there is pivotal motion between the intermediate gimbal ring and either the inner or outer gimbal ring, the sensor/magnet pair which is aligned with the axis of rotation also pivots and the sensor produces an output voltage which is proportional to angle of rotation with a polarity which is dependent upon the direction of rotation in relation to the null point. Hence, a single sensor/magnet pair provides an indication of motion in either the +x and −x or +y and −y directions. When both of the magnets and sensors pivot at the same time, positions between the x and y directions are indicated.

An object of the invention is to provide for sensing motion in the x and y directions using two magnets and sensors.

Another object of the invention is to sense motion in the +x and −x directions with a single sensor/magnet pair.

Another object of the invention is to sense motion in the +y and −y directions with a single sensor/magnet pair.

Another object of the invention is to simplify sensor calibration.

Another object of the invention is to provide a joystick sensor mechanism with contactless sensors.

Another object of the invention is to provide a joystick sensor mechanism having sensors and magnets which pivot about an axis.

Another object of the invention is to provide a joystick sensor mechanism wherein the sensors produce an output signal proportional to angle of rotation.

Another object of the invention is to provide a joystick sensor mechanism wherein the sensors product an output signal having a polarity dependent upon direction of rotation.

Another object of the invention is to provide a joystick sensor mechanism having a gimbal mechanism with two pivoting axes.

Another object of the invention is to provide a multi-axis gimbal mechanism for a joystick wherein magnets pivot in relation to sensors.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Referring more specifically to the drawings, for illustrative purposes the present invention is embodied in the apparatus generally shown in FIG. 1 through FIG. 6. It will be appreciated, however, that the apparatus may vary as to configuration and as to details of the parts without departing from the basic concepts as disclosed herein.

Figure 1:
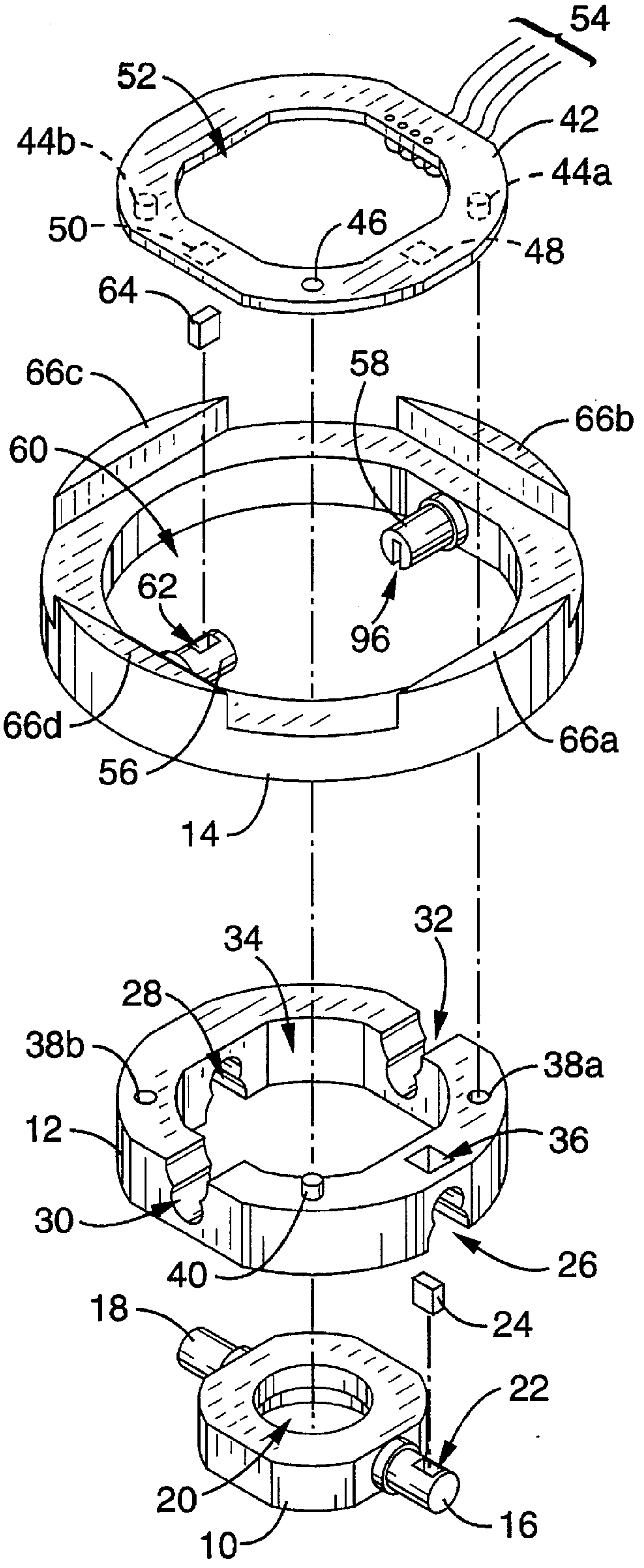
FIG. 1 is an exploded view of a multi-axial position sensing apparatus in accordance with the present invention.
Figure 2:
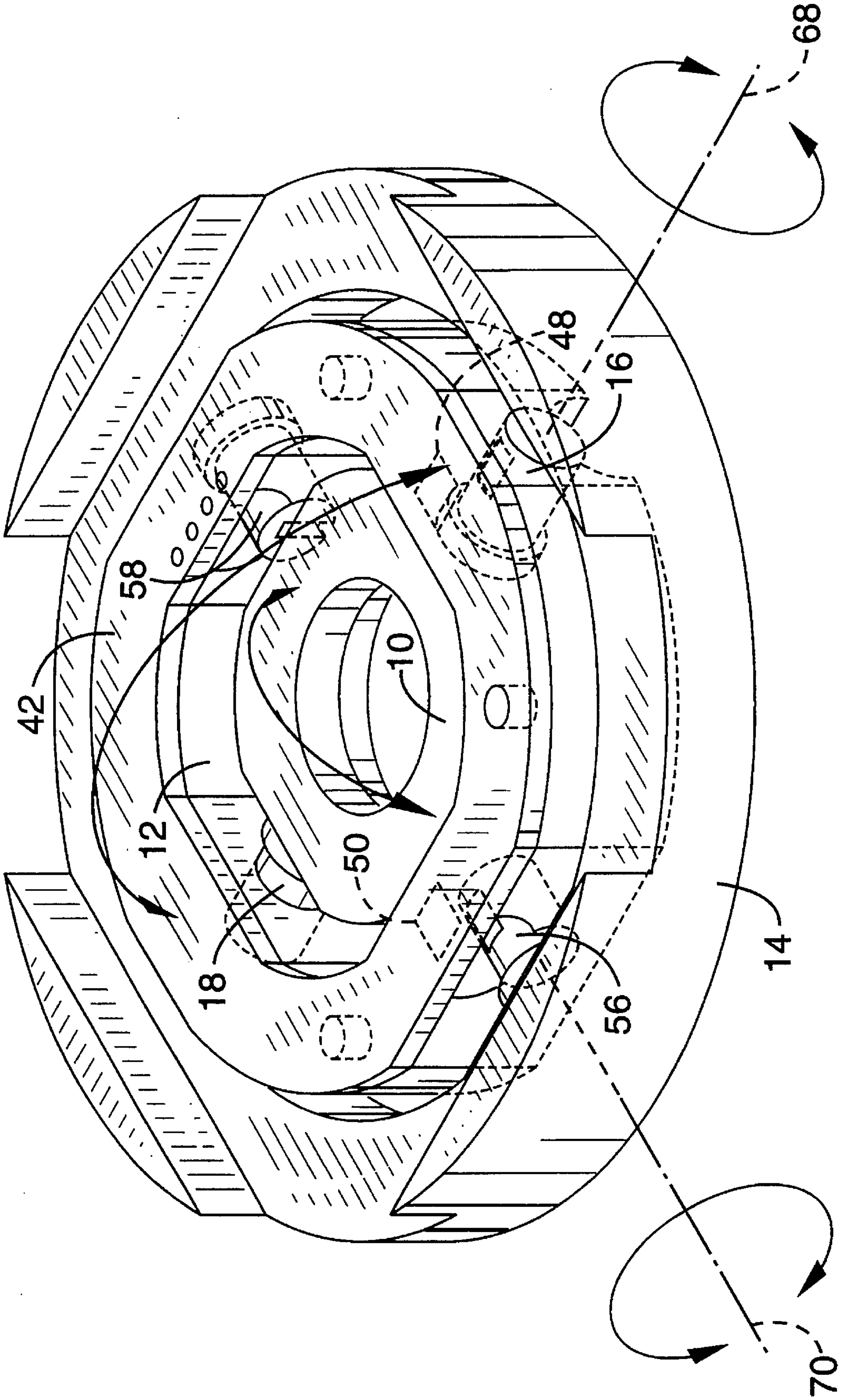
FIG. 2 is an assembled view of the apparatus shown in FIG. 1.

Referring first to FIG. 1 and FIG. 2, the present invention includes an inner gimbal ring 10, an intermediate gimbal ring 12 and an outer gimbal ring 14, each of which is aligned concentrically with the other.

Inner gimbal ring 10 includes first 16 and second 18 cylindrically-shaped pivot arms which extend outward and which are aligned with a central axis through inner gimbal ring 10. Inner gimbal ring also includes a central opening 20 which defines its ring-shaped configuration. First pivot arm 16 includes a receptacle 22 in which a magnet 24 is placed, although receptacle 22 and magnet 24 could alternately be placed in second pivot ann 18 provided that proper alignment with a corresponding sensor is maintained as discussed below. Magnet 24 is a conventional neodymium or like magnet having a high output, and is configured such that its poles are perpendicular to receptacle 22.

Intermediate gimbal ring 12 includes first 26 and second 28 arcuate receptacles on its lower side and third 30 and fourth 32 arcuate receptacles on its upper side, with each receptacle being spaced apart by ninety degrees of rotation around the circumference of intermediate gimbal ring 12. Intermediate gimbal ring 12 also includes a central opening 34 which defines its ring-shaped configuration. First 26 and second 28 receptacles receive first 16 and second 18 pivot arms of inner gimbal ring 10, respectively, with the body of inner gimbal ring 10 fitting within opening 34. Arms 16, 18 and receptacles 26, 28 are coupled such that inner gimbal ring 10 and intermediate gimbal ring 12 can pivot in relation to each other, using a snap-fit or other conventional coupling means. Intermediate gimbal ring 12 also includes a sensor opening 36 which extends through intermediate gimbal ring 12, a pair of alignment holes 38*a*, 38*b*, and an alignment post 40 to facilitate attachment of sensor board 42.

Sensor board 42 is ring-shaped and attaches to the upper side of intermediate gimbal ring 12 using conventional means such as screws, adhesive or the like. Alignment posts 44*a*, 44*b* extend downward from the lower surface of sensor board 42 and mate with alignment holes 38*a*, 38*b*, respectively, and alignment hole 46 mates with alignment post 40 which extends upward from intermediate gimbal ring 12. Sensor board 42 includes first 48 and second 50 sensors which are conventional Hall-effect sensors. Sensors 48, 50 are positioned on sensor board 42 such that their faces and sensor board 42 lie in parallel planes, are spaced apart by ninety degrees of rotation around the circumference of sensor board 42, and are aligned along orthogonal central axes extending through sensor board 42. Sensor board 42 also includes a opening 52 corresponding to opening 28 in intermediate gimbal ring 12 into which inner gimbal ring 10 can be fitted. Additionally, it will be noted that sensor 48 fits into sensor receptacle 36 for exposure to magnet 24. Cable 54 provides for electrical connection between sensors 48, 50 and the sensor circuitry described below.

Outer gimbal ring 14 includes first 56 and second 58 cylindrically-shaped pivot arms which extend inward and which are aligned along a central axis through outer gimbal ring 14. Outer gimbal ring 14 also includes a central opening 60 which defines its ring-shaped configuration. First pivot arm 56 includes a receptacle 62 in which a magnet 64 is placed, although receptacle 62 and magnet 64 could alternately be placed in second pivot arm 58 provided that proper alignment with a corresponding sensor is maintained as discussed below. Magnet 64 is also a conventional neodymium or like magnet having a high output, and is configured such that its poles are perpendicular to receptacle 62. Outer gimbal ring 14 also includes first 66*a*, second 66*b*, third 66*c* and fourth 66*d* ribs projecting upward from its upper surface. Ribs 66*a*, 66*b*, 66*c* and 66*d* have planar inner faces as shown to establish a "square" opening which can receive a slider control and provide for square-pattern movement as discussed below.

Third 30 and fourth 32 receptacles on intermediate gimbal ring 12 receive first 56 and second 58 pivot arms of outer gimbal ring 14, respectively, with the body of intermediate gimbal ring 12 fitting within opening 60 in outer gimbal ring 14. Arms 56, 58 and receptacles 30, 32 are coupled such that outer gimbal ring 14 and intermediate gimbal ring 12 can pivot in relation to each other, using a snap-fit or other conventional coupling means.

Referring now to FIG. 2 which shows an assembly of the components described above, the alignment of the sensors and magnets and relative motion of the gimbal rings can be seen. As discussed above, inner gimbal ring 10 includes pivot arms 16, 18 which are aligned with a central axis 68. Similarly, outer gimbal ring 14 includes pivot arms 56, 58 which are aligned with a central axis 70. As can be seen, when inner gimbal ring 10 and outer gimbal ring 14 are coupled to intermediate gimbal ring 12, the two axes are orthogonal and intersect at the point of concentricity of the gimbal rings. Inner gimbal ring 10 will pivot about axis 68 in relation to intermediate gimbal ring 12 (as well as in relation to outer gimbal ring 14) and outer gimbal ring 14 will pivot about axis 70 in relation to intermediate gimbal ring 12 (as well as in relation to inner gimbal ring 10). This configuration provides for four directions of motion as the gimbal rings rotate about these axes: +x, −x, +y and −y.

Note also that each sensor is aligned above a corresponding magnet to form sensor/magnet pairs. As a result, the magnets will rotate in relation to the sensors as the gimbals rotate. For example, sensor 48 is aligned above magnet 24 and sensor 50 is aligned above magnet 64. It is important that the center of the face of each sensor be aligned directly above the center of the corresponding magnet when the three gimbal rings are positioned in parallel planes. This is the "rest" or "null" position of the mechanism where the sensors will output a reference voltage.

Figure 3:
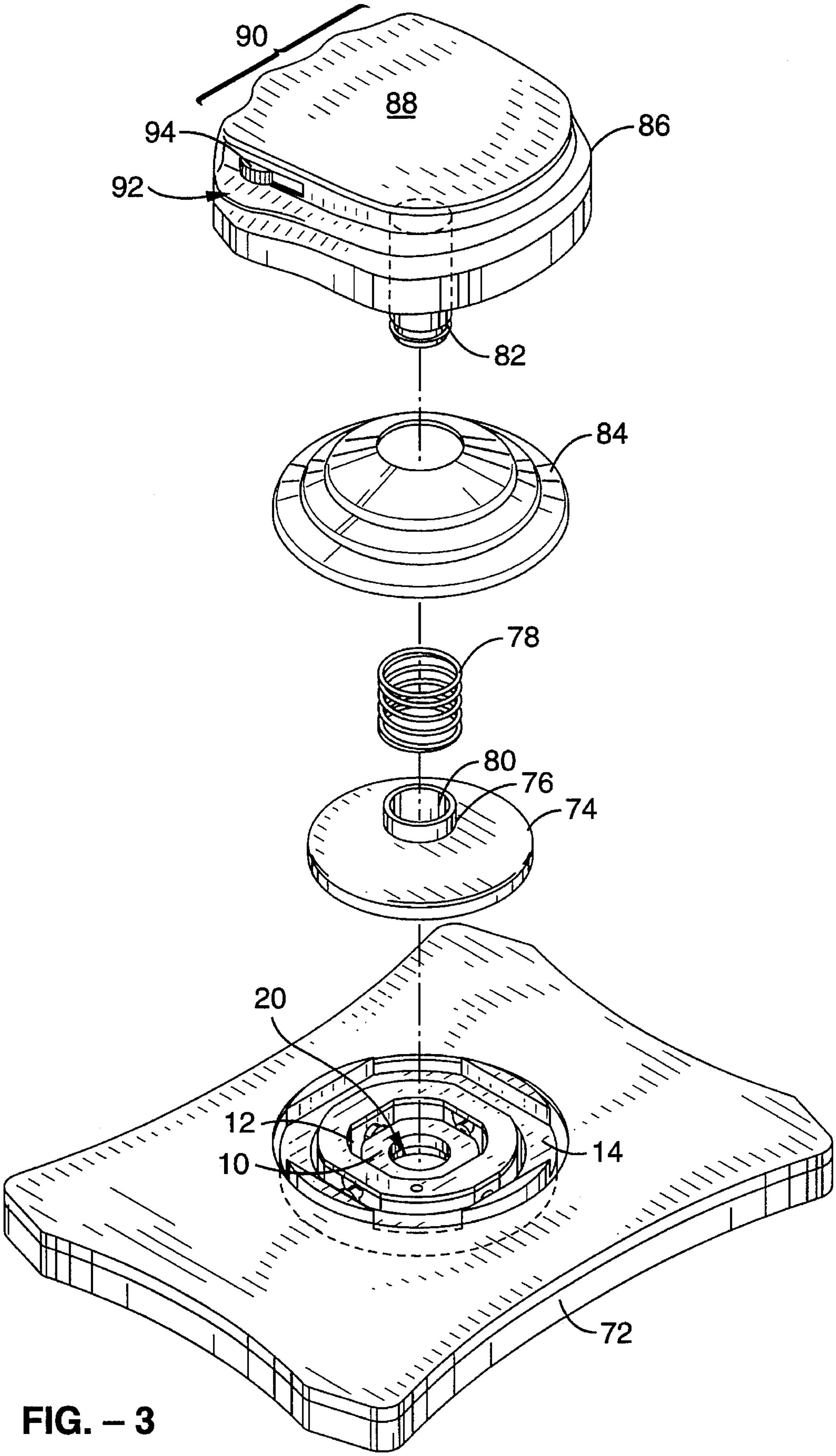
FIG. 3 is an exploded view of a joystick incorporating the apparatus of the present invention.

Referring now to FIG. 1 through FIG. 3, the invention is typically installed in the central opening of a joystick base 72 or the like. In this regard, note that base 72 can have an extremely low profile due to the concentric gimbal rings employed in the present invention. Also note that, since one of the gimbal rings must remain in a stationary position as a reference point for motion, outer gimbal ring 14 is rigidly attached to base 72. Cables 54 from sensor board 42 are typically routed though a channel 96 in arm 58 of outer gimbal ring 14 to circuitry housed in base 72.

A slider 74 fits into the opening in outer gimbal ring 14 defined by the upwardly projecting ribs **66*a*, 66*b*, 66*c*, 66*d*. As discussed previously, these ribs have planer inner faces and are equally spaced apart around the circumference of outer gimbal ring 14 such that a "square" opening is formed. Note also with particular reference to FIG. 2, that these ribs are aligned with the two axis of rotation of the gimbal rings. In this way, movement of slider 74 will follow a square pattern; that is, slider 74 will essentially move only in the x and y directions, and any intermediate motion will be represented by simultaneous movement in the x and y directions. Slider 74 includes a neck 76 over which a spring 78 fits and an opening 80 through which a control shaft 82 extends. Preferably, slider 74, spring 78 and control shaft 82 are covered by a boot 84** for protection from dust and the like.

Control shaft 82 extends into opening 20 in inner gimbal ring 10 where it is locked into place. As a result, movement of control shaft 82 along axis 70 will cause inner gimbal ring 10 to pivot in relation to intermediate gimbal ring 12 and movement along axis 68 will cause intermediate gimbal ring 12 to pivot in relation to outer gimbal ring 14 as can be seen with reference to FIG. 2. Further, movement of control shaft 82 in a direction between axes 68, 70 will result in a combination of the above described rotation motion. During movement of control shaft 82, slider 74 will move upward along control shaft 82 under the tension of spring 78 which abuts a control handle 86. Further, ribs **66*a*, 66*b*, 66*c* and 66*d* which define a square pattern of travel for slider 74** will limit the amount of rotation of the gimbals to approximately twenty-five degrees in each direction.

Control handle 86 is preferably ergonomically designed to include a palm rest area 88, finger rests 90, and a thumb rest 92. One or more control switches (not shown) would typically be positioned adjacent to finger rests 90 for fire control functions and the like. Further, a slide control 94 would typically be positioned adjacent to thumb rest 92 for providing a throttle control. In addition, control handle 86 is preferably configured to rotate in relation to control shaft 82 to provide for z-axis motion for three-dimensional control capabilities. A conventional resistive potentiometer (not shown) would typically be housed in control handle 86 such that rotation of control handle 86 would cause rotation of the potentiometer.

Figure 4C:
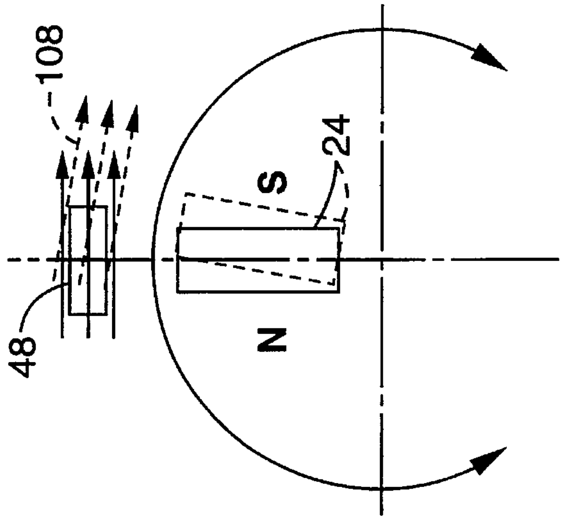
FIG. 4A through FIG. 4C are diagrams showing the general relationship of the field lines emitted by a magnet in the present invention to a sensor in the present invention as the magnet is rotated.
Figure 4B:
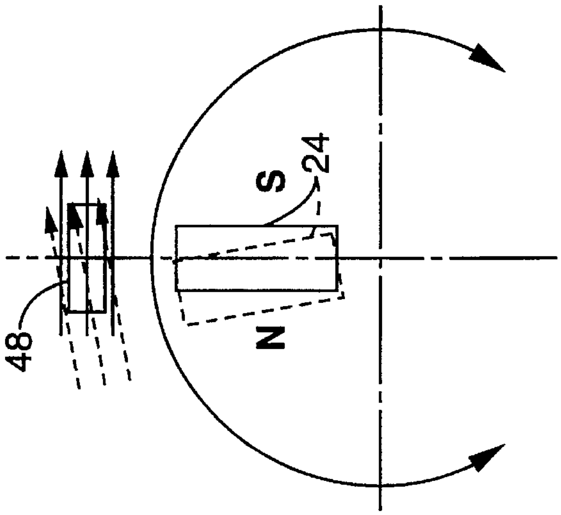

Referring now to FIG. 2 and FIG. 4A through FIG. 4C, the effect of rotation of a magnet in relation to a sensor can be seen. For example, as shown in FIG. 4, when magnet 24 is positioned such that its poles are perpendicular to the face of sensor 48 and sensor 48 is directly centered above magnet 24, the magnetic field lines 108 which extend between the north and south poles of magnet 24 are generally parallel to the face of sensor 48. In this position, which is the null position, there is no rotation between magnet 24 and sensor 48, and the output voltage from sensor 48 is taken as a reference voltage. As magnet 24 rotates about axis 68, magnetic field lines 108 cut through sensor 48 at an angle as shown in FIG. 4B and FIG. 4C. As a result, the voltage output of sensor 48 increases, with the maximum voltage output essentially being produced when magnet 24 and sensor 48 are offset by approximately twenty-five degrees. Beyond that point, the voltage output drops off again.

It will also be noted that the direction in which magnetic field lines 108 pass through sensor 48 is dependent upon the direction of rotation of magnet 24 in relation to the null position. For example, magnetic field lines 108 pass through sensor 48 from front to back when magnet 24 rotates counterclockwise as shown in FIG. 4B and from back to front when magnet 24 rotates clockwise as shown in FIG. 4C. As a result, the polarity of the output voltage produced by sensor 48 is also dependent upon the position of magnet 24 in relation to the null position.

Figure 4A:
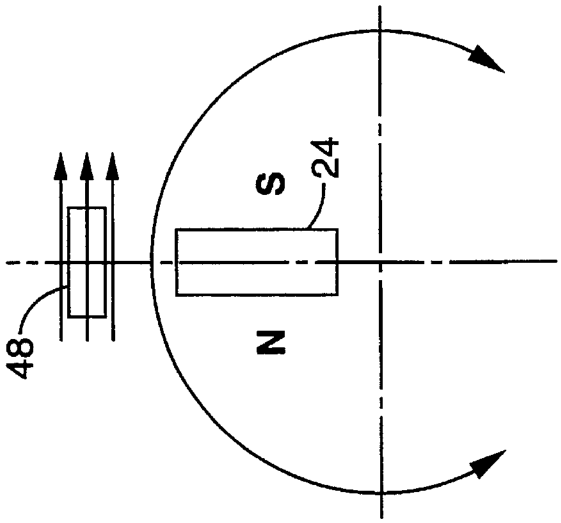
Figure 5:
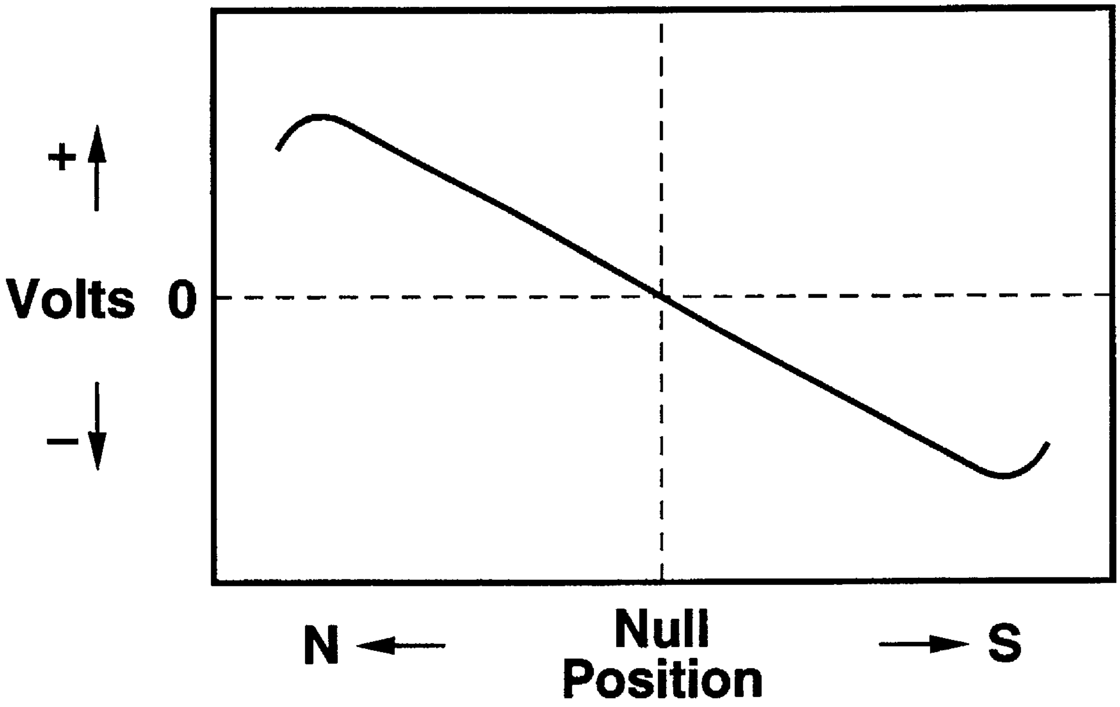
FIG. 5 is a graph showing the voltage output characteristics of the sensors employed in the present invention.

FIG. 5 is a graph showing an example of voltage output profile from the sensor as the magnet rotates in relation to the null position shown in FIG. 4A. The zero volt point along the x-axis of the graph denotes a zero voltage differential from the reference output voltage, and the positive and negative values along that same axis denote voltage differentials. The graph, therefore, shows the change in voltage output as the magnet rotates from the null position to positions where the north pole faces the sensor and from the null position to positions where the south pole faces the sensor. Note that the maximum angle of rotation is preferably limited to ensure operation in the linear portion of the curve.

Figure 6:
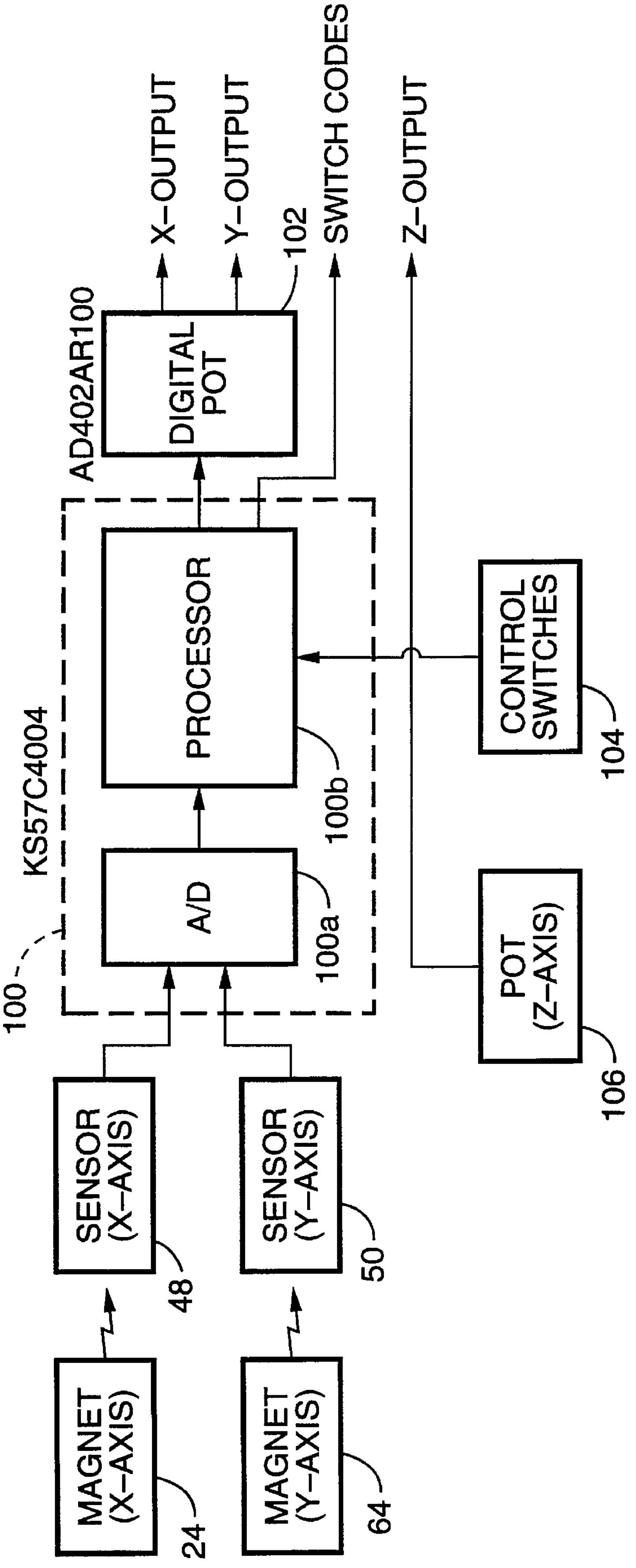
FIG. 6 is a schematic block diagram of the sensing and control circuitry employed in in the present invention.

As discussed above, the outputs of sensors 48, 50 are analog voltages which have an amplitude and polarity. Conventional computer joystick inputs, however, are configured for resistive signals for position indicating. Accordingly, as shown in FIG. 6, the outputs of sensors 48, 50 are directed to a microprocessor 100 or the like which, in the preferred embodiment, is a Samsung KS57C4004. This device includes an analog to digital converter **100*a* and a 4-bit processor 100*b*. The analog sensors signals are converted to digital signals and processed as may be required or desirable. For example, microprocessor 100 would typically include software to calibrate the sensor outputs and to compensate for drift that may occur due to temperature changes and the like. The digital signals are then directed to a digital pot 102 such as an Analog Devices AD402AR100 which is a dual segment device, one segment producing the resistive values for the x-axis and the other segment producing resistive values for the y-axis. Additionally, the switch closures from finger switches 104 adjacent to finger rests 90 would be converted to appropriate control signals for the computer to be controlled. For three-dimensional control, a potentiometer 106** for z-axis motion would be directly connected to the input of the computer to be controlled. Alternatively, a Hall-effect sensor and magnet with appropriate interface circuity could be employed instead of a potentiometer.

Accordingly, it will be seen that this invention comprise a contactless multi-axial position sensor apparatus which can sense motion in the +x, −x, +y and −y directions using only two magnets and sensors, thereby allowing for a lower profile assembly, lower cost, easy calibration, and higher accuracy than conventional sensing devices. Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A multi-dimensional position sensing apparatus, comprising:

(a) concentric inner, intermediate and outer gimbal rings;

(b) means for pivotally coupling said gimbal rings;

(c) first and second magnets;

(d) first and second magnetic sensors, said first sensor opposing said first magnet, said second sensor opposing said second magnet; and (e) means for coupling said magnets and said sensors to said gimbal rings wherein said first sensor and said first magnet pivot in relation to each other and wherein said second sensor and said second magnet pivot in relation to each other.

2. An apparatus as recited in claim 1, wherein said first and second magnets and said first and second corresponding sensors are offset approximately ninety degrees circumferentially around said gimbal rings.

3. An apparatus as recited in claim 1, wherein said first magnet is coupled to said inner gimbal ring, said second magnet is coupled to said outer gimbal ring, and said first and second sensors are coupled to said intermediate gimbal ring.

4. An apparatus as recited in claim 1, wherein said inner gimbal ring pivots in relation to said intermediate gimbal ring about a first axis, wherein said outer gimbal ring pivots in relation to said intermediate gimbal ring about a second axis, wherein said first and second axes are orthogonal, and wherein said first and second axes intersect at the center of concentricity of said gimbal rings.

5. An apparatus as recited in claim 4, wherein said first magnet and said first sensor are positioned along said first axis, and wherein said second magnet and said second sensor are positioned along said second axis.

6. An apparatus as recited in claim 1, wherein each said sensor outputs a voltage signal proportional to angle of rotation, said output signal having a polarity dependent direction of rotation.

7. An apparatus as recited in claim 6, wherein each said sensor produces a zero reference voltage when said sensor is aligned with the magnet opposing said sensor.

8. An apparatus as recited in claim 7, further comprising means for converting the output voltage from each said sensor to a resistive signal.

9. A position indicating apparatus for a joystick, comprising:

(a) concentric inner, intermediate and outer gimbal rings;

(b) means for pivotally coupling said gimbal rings wherein said inner gimbal ring pivots in relation to said intermediate gimbal ring about a first axis, wherein said outer gimbal ring pivots in relation to said intermediate gimbal ring about a second axis, wherein said first and second axes are orthogonal, and wherein said first and second axes intersect at the center of concentricity of said gimbal rings;

(c) first and second magnets;

(d) first and second magnetic sensors, said first sensor opposing said first magnet, said second sensor opposing said second magnet; and (e) means for coupling said magnets and said sensors to said gimbal rings wherein said first sensor and said first magnet pivot in relation to each other and wherein said second sensor and said second magnet pivot in relation to each other.

10. An apparatus as recited in claim 9, wherein said first magnet is coupled to said inner gimbal ring, said second magnet is coupled to said outer gimbal ring, and said first and second sensors are coupled to said intermediate gimbal ring.

11. An apparatus as recited in claim 9, wherein said first magnet and said first sensor are positioned along said first axis, and wherein said second magnet and said second sensor are positioned along said second axis.

12. An apparatus as recited in claim 9, wherein each said sensor outputs a voltage signal proportional to angle of rotation, said output signal having a polarity dependent upon direction of rotation.

13. An apparatus as recited in claim 12, wherein each said sensor produces a zero reference voltage when said sensor is aligned with the magnet opposing said sensor.

14. An apparatus as recited in claim 13, further comprising means for converting the output voltage from each said sensor to a resistive signal.

15. An apparatus for indicating direction of motion of a joystick, comprising:

(a) concentric inner, intermediate and outer gimbal rings;

(b) means for pivotally coupling said gimbal rings wherein said inner gimbal ring pivots in relation to said intermediate gimbal ring about a first axis, wherein said outer gimbal ring pivots in relation to said intermediate gimbal ring about a second axis, wherein said first and second axes are orthogonal, and wherein said first and second axes intersect at the center of concentricity of said gimbal rings;

(c) first and second magnets, said first magnet coupled to said inner gimbal ring, said second magnet coupled to said outer gimbal ring; and (d) first and second magnetic sensors, said first sensor opposing said first magnet, said second sensor opposing said second magnet, said first and second sensors coupled to said intermediate gimbal ring, said first magnet and said first sensor positioned along said first axis, said second magnet and said second sensor positioned along said second axis;

(e) wherein said first magnet pivots in relation to said first sensor and wherein said second magnet pivots in relation to said second sensor, each said sensor outputting a voltage signal proportional to angle of rotation, said output signal having a polarity dependent upon direction of rotation, each said sensor producing a zero reference voltage when said sensor is aligned with the magnet opposing said sensor.

* * * * *